United States Patent [19]

Okuda et al.

[11] Patent Number: 5,347,462
[45] Date of Patent: Sep. 13, 1994

[54] METHOD FOR MACHINING PRINTED CIRCUIT BOARD

[75] Inventors: Kiyoshi Okuda; Masatoshi Araki, both of Tokyo, Japan

[73] Assignee: Seikosha Co., Ltd., Tokyo, Japan

[21] Appl. No.: 28,883

[22] Filed: Mar. 10, 1993

[30] Foreign Application Priority Data

Mar. 11, 1992 [JP] Japan .................. 4-052718

[51] Int. Cl.⁵ .................. G06F 15/46; B23B 49/04
[52] U.S. Cl. .................. 364/474.34; 364/474.01; 356/243; 356/375; 356/384; 408/16
[58] Field of Search .................. 364/167.01, 474.35, 364/474.34, 474.01; 358/101; 356/384, 400, 375, 243; 408/3, 16

[56] References Cited

U.S. PATENT DOCUMENTS

| | | | |
|---|---|---|---|
| 4,481,533 | 11/1984 | Alzmann et al. | 358/101 |
| 4,790,694 | 12/1988 | Wilent et al. | 408/16 |
| 4,829,375 | 5/1989 | Alzmann et al. | 356/401 |
| 5,233,536 | 8/1993 | Araki et al. | 364/474.34 |

*Primary Examiner*—Paul Gordon
*Attorney, Agent, or Firm*—Jordan and Hamburg

[57] ABSTRACT

In order to enable the determination of a center precisely and automatically, a reference mark on a printed circuit board is image-recognized to determine tone transition points, thereby to determine an interim center and diameter of the mark by a four-points searching method. Next, a preset minute value $\alpha$ is added to the interim mark diameter to determine a standard circle diameter, thereby to set a standard circle having the interim center as its center. Then, image processing is performed in that standard circle and the mark is separated into a plurality of sections. The center of the mark is detected by determining the center of the section of the tone indicating the mark. Machining operations such as the perforations are carried out on the basis of the detected center.

10 Claims, 10 Drawing Sheets ial portion of the perforating means of the machining

METHOD FOR MACHINING PRINTED CIRCUIT BOARD

FIELD OF THE INVENTION

The present invention relates to a printed circuit board machining method for perforating a standard hole on the basis of the position of a reference mark formed in advance, the reference mark being detected by image-recognizing the reference mark.

BACKGROUND OF THE INVENTION

In the past, either one of the following two methods has been mainly used for detecting the center position of a reference mark formed in advance on a printed circuit board, for providing a standard for the machining position, when a printed circuit board is to be machined.

The first method is the so-called "four-points searching method". According to this method, a reference mark is image-recognized to determine the tone transition point on X and Y axes in an image recognition step, i.e., the coordinates of intersections of the outer periphery of the mark on the X and Y axes, and the averages of the intersections coordinates are computed for the X and Y axes, respectively, and used as the coordinates of the center of the mark.

The second method comprises detecting the center of an area by an image processing. According to this method, the center position of a reference mark is detected by setting a standard circle containing the mark, setting both a plurality of X-direction parting lines arrayed at an equal pitch in parallel with the X axis and a plurality of Y-direction parting lines arrayed at an equal pitch in parallel with the Y axis, separating the standard circle into a plurality of sections by those X and Y-parting lines, deciding the individual tones of the sections by image processing, determining the centers of the sections having the same tone (i.e., the tone indicating the inside of the mark, such as a black tone) along the individual parting lines, and determining those averages individually in the X and Y-directions.

According to the aforementioned first method (i.e., the four-points searching method) of the prior art, there arises a problem that a precise detection of the center cannot be accomplished if the reference mark is not a real circle as a result of a printing error.

For example, if a mark 80 has a chipped portion 80a on the X axis 81a, as shown in FIG. 9, the averages, even if computed, of the tone transforming points Xa and Xb on the X axis 81a and the tone transforming points Ya and Yb on the Y axis 81b have their coordinates located at the position 80b, which is offset rightward of the drawing so that they are largely displaced from the precise center.

According to the second known method (i.e., the method for detecting the center of the area by the image processing), on the other hand, a precise center position can be determined even if the reference mark is not a real circle, but a proper standard circle has to be set. Each time the size of the mark changes, the setting of the standard circle has to be troublesomely renewed. Specifically, if a standard circle 82 is excessively large, as shown in FIG. 10, circuit patterns 84a and 84b outside of a reference mark 83 are contained in the standard circle 82 and also become part of the data for detecting the center of the area, so that the coordinates finally determined are offset from the values of the actual mark center. If the circuit patterns 84a and 84b are in the standard circle, for example, the intrinsic center of the sections on an X-direction parting line 85a should be decided on the basis of the black tone ranges by six sections to the left and by three sections to the right from the Y axis, and their center is located in the position (in the vicinity of the actual mark center) offset by 1.5 sections to the left. However, the section on an X-direction parting line 85b is decided as the black tone for the two sections to the left from the Y axis 86 and for the four sections to the right because of the circuit pattern 84a. If these averages are taken, the determined coordinates are offset rightward from the intrinsic mark center. If the standard circle is excessively small, on the contrary, the reference mark 83 cannot be contained in its entirety within the standard circle so that the precise center cannot possible be determined. Therefore, each time the standard circle is set in the printed circuit board formed with different marks so as to set a standard circle having a proper size according to the reference mark 80, the user must check the image taken by imaging means and select a standard circle having a proper size, so that the operation is difficult to automate.

SUMMARY OF THE INVENTION

Therefore, an object of the present invention is to provide a method for machining a printed circuit board capable of detecting the center precisely and automatically for reference marks of various sizes.

The method of the present invention comprises: detecting the position of a reference mark, formed in advance in the printed circuit board, using imaging means and image processing devices, and machining the printed circuit board with machining means with reference to the detected mark position. In the mark position detecting step of the present invention, moreover, the mark is image-recognized to detect a tone transition point on X and Y axes in the image recognition step, and the interim center and diameter of the mark are determined on the basis of the tone transition point. Next, a predetermined minute value is added to the mark diameter to derive the diameter of a standard circle, thereby to set a standard circle having the derived value for its diameter and the interim center as its center. Image-processing is performed in the standard circle to determine the center of the mark.

BRIEF DESCRIPTION OF THE DRAWINGS

One embodiment of the present invention will be described in the following disclosure with reference to the accompanying drawings, wherein.

DESCRIPTION OF THE PREFERRED EMBODIMENTS

Figure 1:
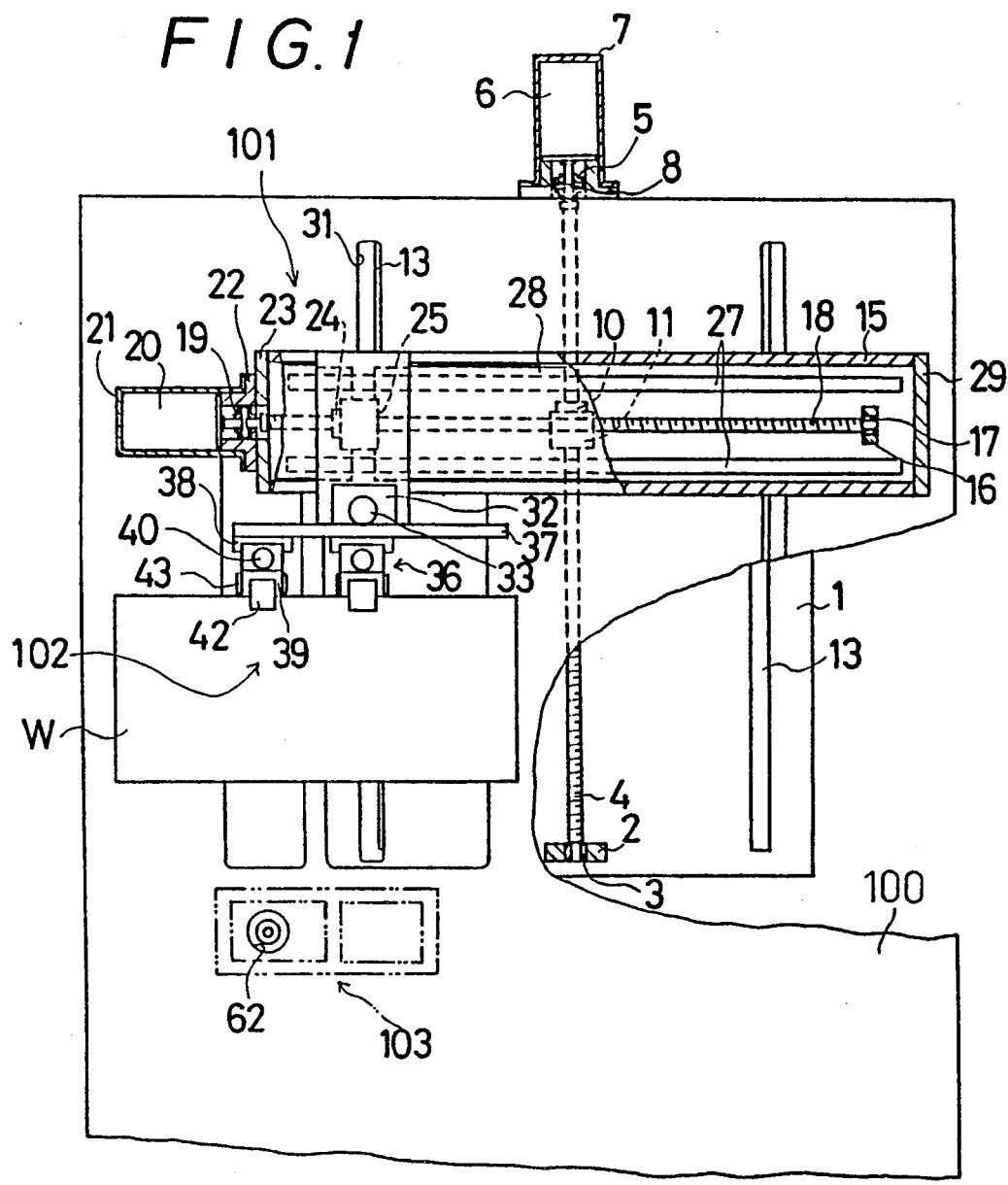
FIG. 1 is a partially cut-away top plan view showing a printed circuit board machining device according to the present invention.
Figure 2:
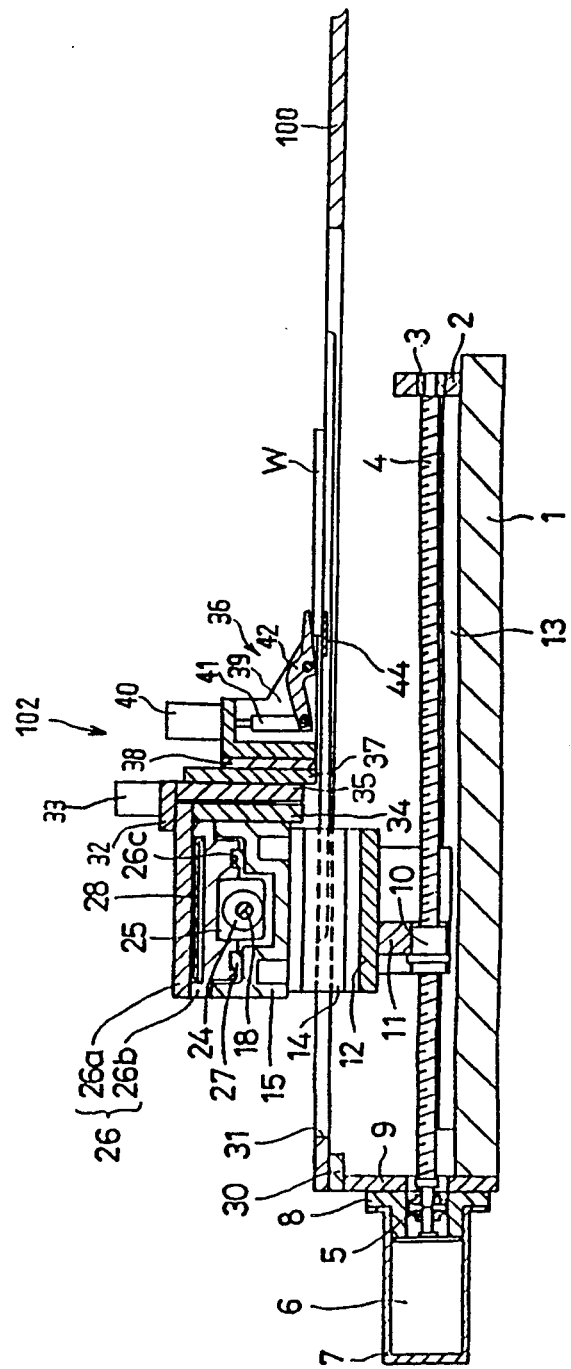
FIG. 2 is a sectional side view showing an essential portion of the machining device.

FIGS. 1 and 2 show the structure of a circuit board machining device to be used in the present embodiment of the invention. This device includes a fixed table 100, an X-Y table 101, holding means 102, and perforating means 103 serving as a machining means. A printed circuit board (or work) W supplied by the not-shown supplying means is conveyed to a machining position by the X-Y table 101 and the holding means 102 and is then perforated in its mark position with a standard hole by the perforating means 103.

The detailed structure of this circuit board machining device will now be described.

The X-Y table 101 has the following structure:

On a Y-axis base 1, there is erected a supporting pole 2, on which is rotatably supported one end of a Y-axis screw 4 via bearing 3. The other end of the Y-axis screw 4 is connected via a coupling 5 to the drive shaft of a motor 6. This motor 6 is fixed by a cover 7 and a mounting plate 8 to a side plate 9, which is fixed on the Y-axis base 1, so that the Y-axis screw 4 is supported substantially in a horizontal position. On the Y-axis screw 4, there is meshed a nut 10, on which is integrally fixed a nut holder 11. On the upper face of the nut holder 11, there is fixed a Y-axis table 12. This Y-axis table 12 is short in the Y-axis direction (i.e., vertically in FIG. 1) and long in the X-axis direction (i.e., horizontally in FIG. 1). Moreover, the Y-axis table 12 is equipped on its lower face with two rail guides (although not shown), which can slide on two rails 13 on the Y-axis base 1.

To the upper face of the Y-axis table 12, there is attached, via two mounting blocks 14 an X-axis base 15. On this X-axis base 15 in a manner similar to the Y-axis base 1, there is rotatably supported one end of an X-axis screw 18 via a supporting pole 16 and a bearing 17. The other end of the X-axis screw 18 is connected to a motor 20 via a coupling 19. This motor 20 is fixed on the X-axis base 15 by a cover 21, a mounting plate 22 and a side plate 23 so that the X-axis screw 18 is supported substantially in a horizontal position. On the X-axis screw 18, there is meshed a nut 24, on which is integrally fixed a nut holder 25. On the upper face of the nut holder 25, there is fixed an X-axis table 26. On the X-axis table 26, there are fixed an upper plate 26a and a lower plate 26b. On the lower face of the lower plate 26b, there is mounted a rail guide 26c which can slide on a rail 27 of the X-axis base 15. In the bore 26d of the X-axis table 26, on the other hand, there is inserted an upper face cover 28. This upper face cover 28 is not fixed on the X-axis table 26 but extends sideways, of the X-axis table 26 to have its two end portions fixed on the two side plates 23 and 29. As a result, the X-axis table 26 can slide relative to the upper face cover 28.

The fixed table 100 is fixed to the side plate 29 via a flange 30. This fixed table 100 is formed with two slits 31, and the X-Y table 101 is so disposed such that the mounting block 14 extends through the slits 31. As a result, the Y-axis table 12 moves within the range of the slits 31 in the Y-direction, and the X-axis table 26 can move above the fixed table 100 in the X-direction.

With the construction thus far described, when the Y-axis screw 4 is rotated by the drive of the motor 6, the nut 10 meshing with the Y-axis screw 4 is moved in the Y-direction so that the Y-axis table 12 is moved. On the other hand, when the X-axis screw 18 is rotated by the drive of the motor 20, the nut 24 meshing with the X-axis screw 18 is moved in the X-direction so that the X-axis table 26 is moved. Thus, the X-axis table 26 can be freely moved in the X- and Y-directions by the motors 6 and 20.

The holding means 102 will now be described.

On the upper face of the front end (as located at the righthand of FIG. 2) of the X-axis table 26, there is fixed a cylinder mounting plate 32. To the upper portion of the cylinder mounting plate 32, there is attached a cylinder 33 in a downward position. To the front of the X-axis table 26, moreover, there is vertically movably attached a slider 35 via a mounting plate 34.

In front of the slider 35, there is disposed a clamp 36 having the following construction.

On the upper face of the slider 35, there is fixed the drive shaft of the cylinder 33. To the front of the slider 35, there is attached via mounting plates 37 and 38 a chuck body 39. To the upper portion of the chuck body 39, there is attached a cylinder 40 in a downward position. To the shaft of the cylinder 40, there is fixed a rod 41 having an upper pawl 42 attached thereto. This upper pawl 42 rocks on its center of rotation 42a in accordance with the vertical movements of the rod 41. Below the chuck body 39, there is disposed a lower pawl 44 which is fixed by a fixing member 44. In the present embodiment, the slider 35 is equipped with two clamps 36 having the construction described above.

The perforating means 103 will now be described with reference to FIG. 3.

On a leg 45, there are fixed supporting plates 46 and 47 which each have a hole at their respective central portions. To first end portions (as located at the lefthand side of FIG. 3) of the supporting plates 46 and 47, there is fixed a motor supporting member 48, by which a motor 49 is supported. To the drive shaft of this motor 49, there is connected, via a coupling 50, a lead screw 51, which is rotatably supported by the supporting plate 47. Above the lead screw 51, there is arranged a base plate 52, and a nut 53 fixed on the lower face of the base plate 52 is in meshing engagement with the lead screw 51. With this construction, the lead screw 51 is rotated by the drive of the motor 49 so that the base plate 52 is moved to the right and left of FIG. 3 integrally with the nut 53.

Above the base plate 52, there is fixed, via supporting plates 54, 55 and 56, imaging means for displaying the image of an object to be exposed to the irradiation of the electromagnetic waves. In the present embodiment, the electromagnetic waves are exemplified by an X-ray so that an X-ray camera 57 is used as the imaging means. This X-ray camera 57 is connected to an image processing device 58 (as shown in FIG. 4).

Above the base plate 52, on the other hand, a perforating unit 61 is disposed, via a supporting frame 59 and a chip cover 60. This perforating unit 61, includes a spindle motor 61a, a collet chuck 61b fixed on the upper end of the spindle motor 61a, and a drill (or perforating member) 61c supported by the collet chuck 61b. Thus, the drill 61c is lifted, while rotating, by the drive of the spindle motor 61a to perforate the printed circuit board W. The perforating unit 61 can be moved by the not-shown X-Y table mechanism to finely adjust the position of perforation.

Figure 3:
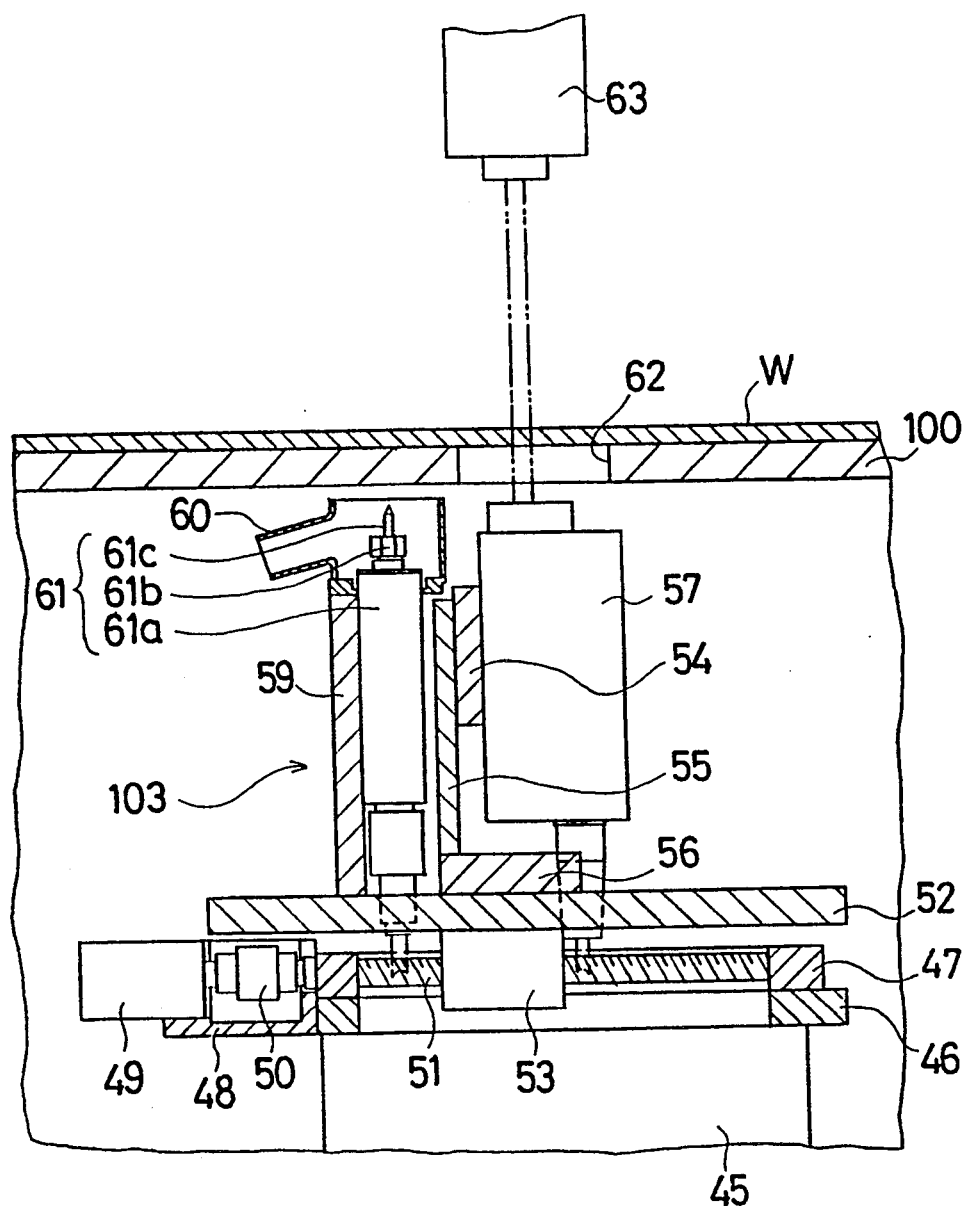
FIG. 3 is a sectional front elevation showing an essential portion of the perforating means of the machining device.

In the above-described arrangement, the X-ray camera 57 and the perforating unit 61 can move integrally with the base plate 52 to the right and left (i.e., in the X-direction) in FIG. 3. This body case is equipped with the fixed table 100, on which the printed circuit board W to be perforated is placed. The fixed table 100 is perforated by a hole 62. Above the fixed table 100, moreover, there is disposed an X-ray generating device (or electromagnetic wave irradiating means) 63 which can face the X-ray camera 57 or the perforating unit 61 through the hole 62 and the printed circuit board W. Specifically, FIG. 3 shows the state in which the X-ray camera 57 faces the X-ray generating device 63 through the hole 62 and the printed circuit board W. By operating the motor 49 from this state to move the base plate 52, the perforating unit 61 is enabled to face the X-ray generating device 63 through the perforating unit 61 and the hole 62.

Figure 4:
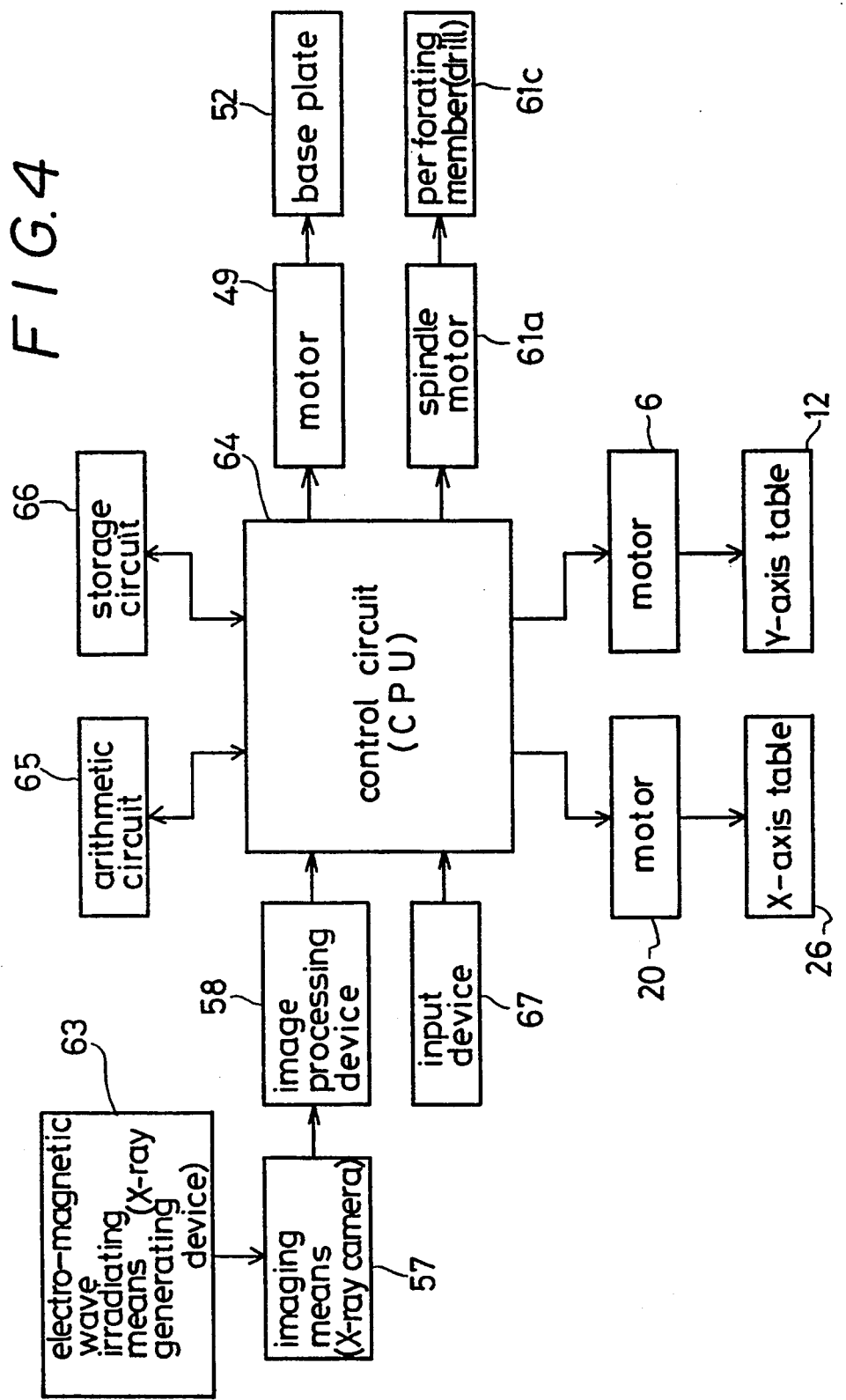
FIG. 4 is a block diagram showing the machining device.

The electric circuit of this machining device has a construction as shown in FIG. 4. Specifically, a control circuit (which will be hereinafter referred to as the "CPU") 64 for controlling the operations of the entire machining device, is connected to the image processing device 58, an arithmetic circuit 65, a storage circuit 66, and an input device 67 including a keyboard (although not shown) for the user to input the perforating conditions therein. The CPU 64 is also connected to the aforementioned motors 6, 20 and 49 and the spindle motor 61a for controlling the operations of the Y-axis table 12, the X-axis table 26, the base plate 52 and the perforating member 61c, respectively. The image processing device 58 feeds the image data which are obtained by the X-ray generating device (or the electromagnetic wave irradiating means) 63 and the X-ray camera (or the imaging means) 57.

Figure 5:
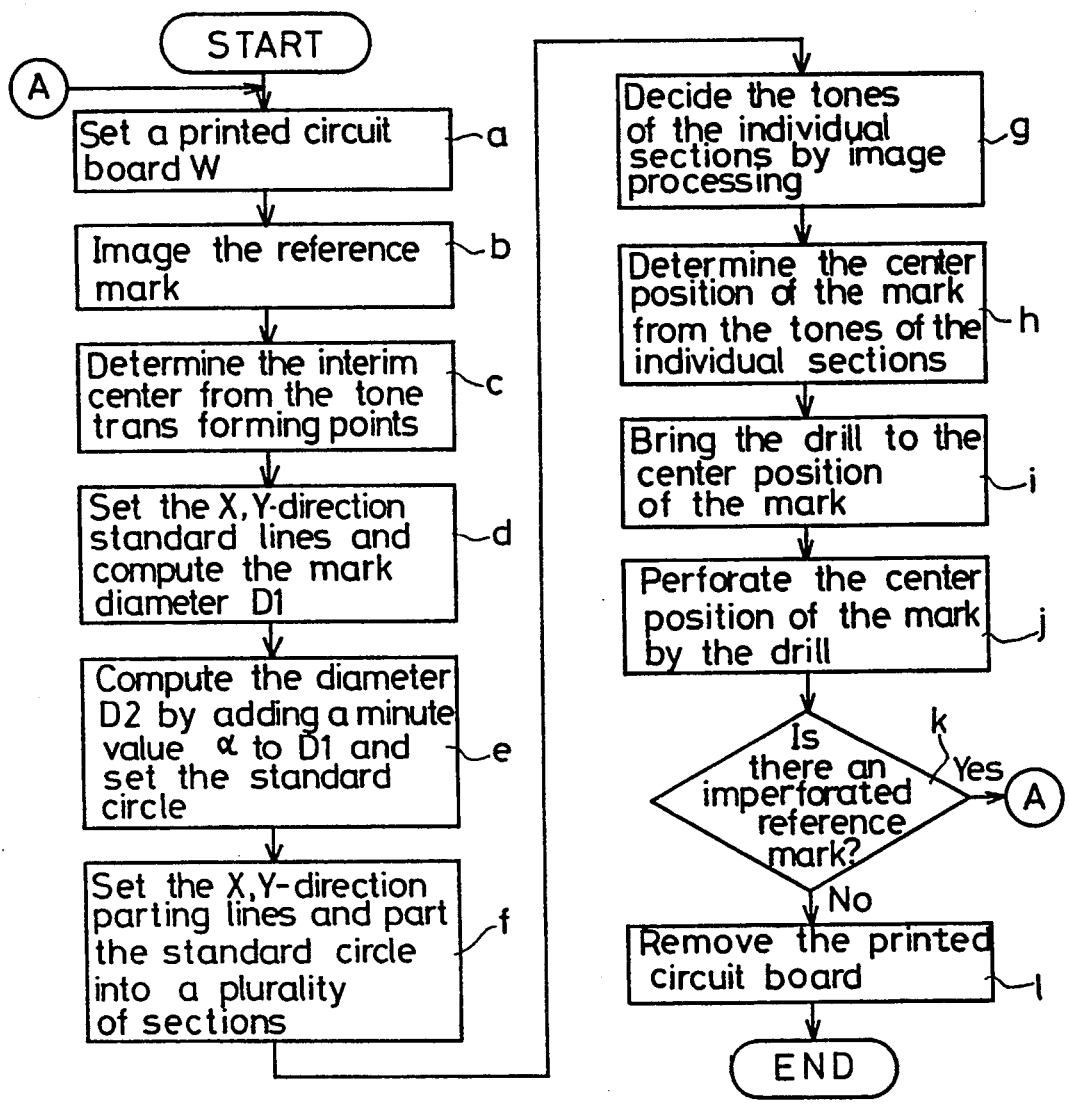
FIG. 5 is a flow chart showing the machining procedure of the present invention.

The method for perforating a standard hole in the printed circuit board W, using the machining device having the construction thus far described, will now be described with reference to FIGS. 5 and 8.

Figure 6:
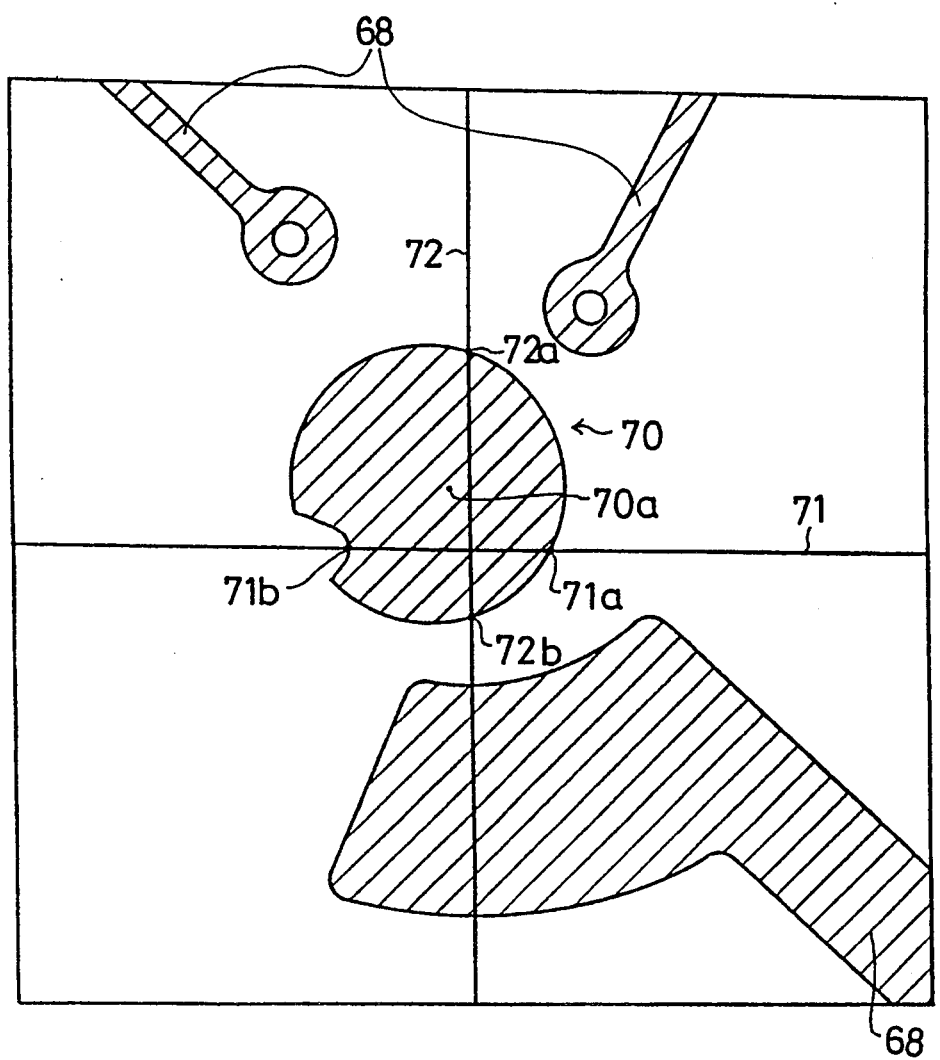
FIG. 6 is an explanatory diagram illustrating the setting of an interim center in the mark position detecting process of the present invention.

The printed circuit board W to be machined is used to manufacture a plurality of parts (or printed boards). The printed circuit board W is printed at a constant pitch with a plurality of circuit patterns 68 (as shown in FIG. 6) which may have different shapes. In conformity with each of the circuit patterns, the printed circuit board W is pressed or perforated for parts mounting holes to form a plurality of desired wiring boards. In order to exhibit the standard position at this pressing time, therefore, the printed circuit board W is formed with a reference mark 70 in the vicinity of each circuit pattern. In the present embodiment, the position of the reference mark 70 is perforated to provide a standard hole for the subsequent pressing step. Usually, this reference mark 70 is formed by the printing simultaneous with the circuit pattern 68.

First, the printed circuit board W is set in the machining device, as shown in FIGS. 1 and 2. Specifically, the printed circuit board W is held by the clamp 36 of the holding means 102 and is moved by the X-Y table mechanism 101 by driving the motors 6 and 20 so that it may be positioned to have its mark 70 facing the perforating means 103 (at Step a).

The reference mark 70 is now irradiated with an X-ray by the X-ray generating device 63 so that its X-ray image is taken by the X-ray camera 57 (at Step b). At this time, the portion of the mark 70 and the other portions are taken in different tones (or contrasts), upon which the image processing is carried out to detect the center of the mark 70. The portions in the black tone (i.e., the insides of the reference mark 70 and the circuit pattern 68) are hatched.

The method for detecting the center of that mark 70 will now be described.

First, as shown in FIG. 6, tone transition points on the X axis 71 and the Y axis 72 are preset in the X-ray camera 57, that is, the four intersecting points 71a (X1, Y1), 71b (X2, Y2), 72a (X3, Y3) and 72b (X4, Y4) between the X axis 71 and the Y axis 72 and the outer periphery (i.e., the boundary lines having contrasts changed) of the imaged mark 70 are recognized. An origin is located at the intersecting point between the X axis 71 and the Y axis 72. Then, the X coordinates of the intersecting points 71a and 71b between the outer periphery of the mark 70 and the X axis 71 are bisected to determine (X1+X2)/2. Likewise, the Y coordinates of the intersecting points 72a and 72b between the outer periphery of the mark 70 and the Y axis 72 are bisected to determine (Y3+Y4)/2. Thus, the coordinates {(X1+X2)/2, (Y3+Y4)/2} of the interim center of the mark 70 are determined (at Step c).

Figure 7:
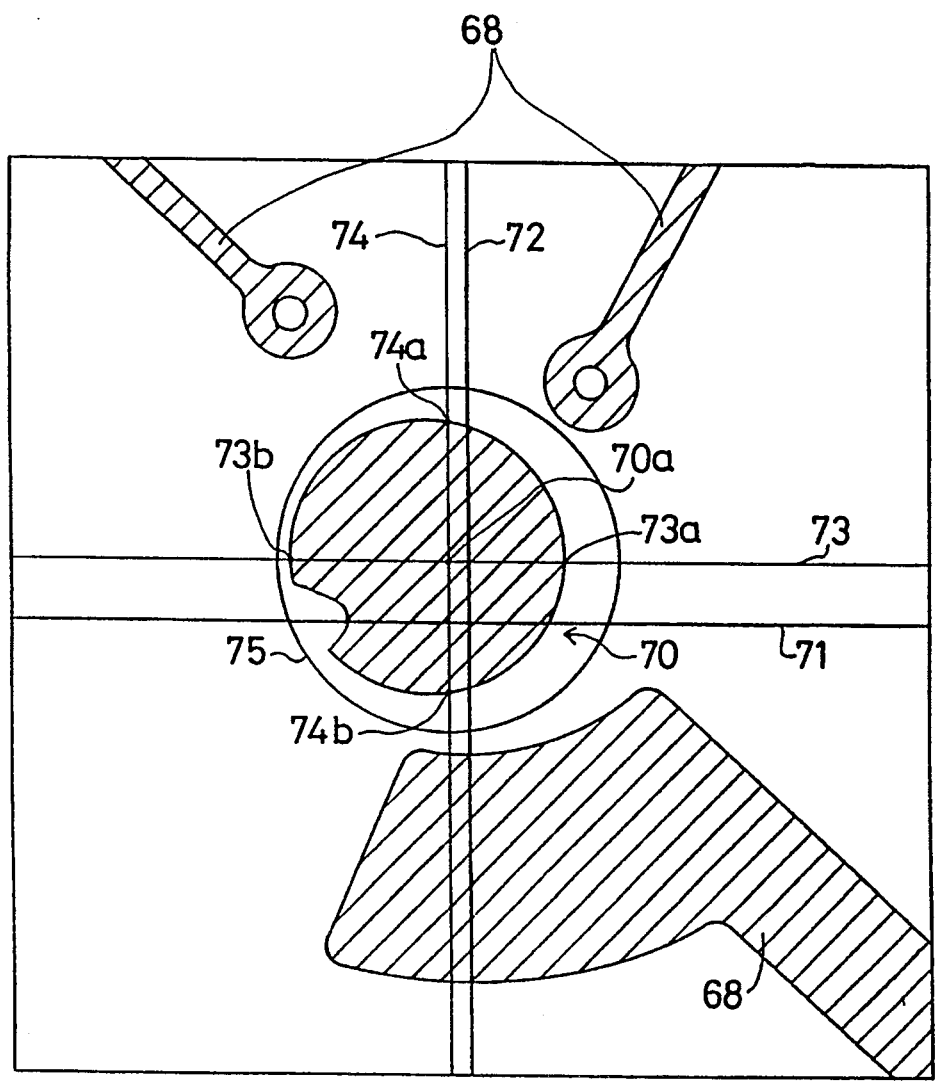
FIG. 7 is an explanatory diagram illustrating the setting of a standard circle in the mark position detecting process of the present invention.

Next, as shown in FIG. 7, an X-direction standard line 73 passing through the interim center 70a parallel to the X axis 71 and a Y-direction standard line 74 parallel to the Y axis 72 are set. Then the tone transition points on the Y-direction standard line 73 and the Y-direction standard line 74, that is, the four intersecting points 73a (X5 Y5), 73b (X6, Y6), 74a (X7, Y7) and 74b (X8, Y8) between the X-direction standard line 73 and the Y-direction standard line 74 and the outer periphery of the mark 70 are recognized to compute the X-direction diameter (X5−X6) and Y-direction diameter (Y7−Y8) of the mark 70, respectively, and these computed values are averaged to compute a mark diameter D1={(X5−X6)+(Y7−Y8)}/2 (at Step d). Incidentally, if the mark 70 is a real circle, the relation of (X5−X6)=(Y7−Y8) holds, and there is no necessity for determining the average value. Since, however, the X-direction diameter and the Y-direction diameter may have more or less errors due to the printing errors, the two values are averaged and used as the mark diameter D1.

Thereafter, a standard circle diameter D2 is computed by adding a preset minute value α to the aforementioned mark diameter D1:

$$D2 = D1 + \alpha = \{(X5-X6) + (Y7-Y8)\}/2 + \alpha.$$

Thus, the interim center 70a and the standard circle diameter D2 are determined to set a standard circle 75 thereon (at Step e). In the present embodiment, the minute value α=1.5 mm is set in advance. For the reference mark 70 having the diameter of D1=2 mm, for example, the standard circle 75 having the diameter of D2=2.5 mm is automatically set. Since the standard circle 75 having a slightly (by only 0.5 mm in the present embodiment) larger diameter D2 than the mark diameter D1 is set, any circuit pattern 68 other than the mark 70 will hardly encroach upon the standard circle 75.

The center of the area is now detected by imaging processing on the basis of that standard circle 75.

Figure 8:
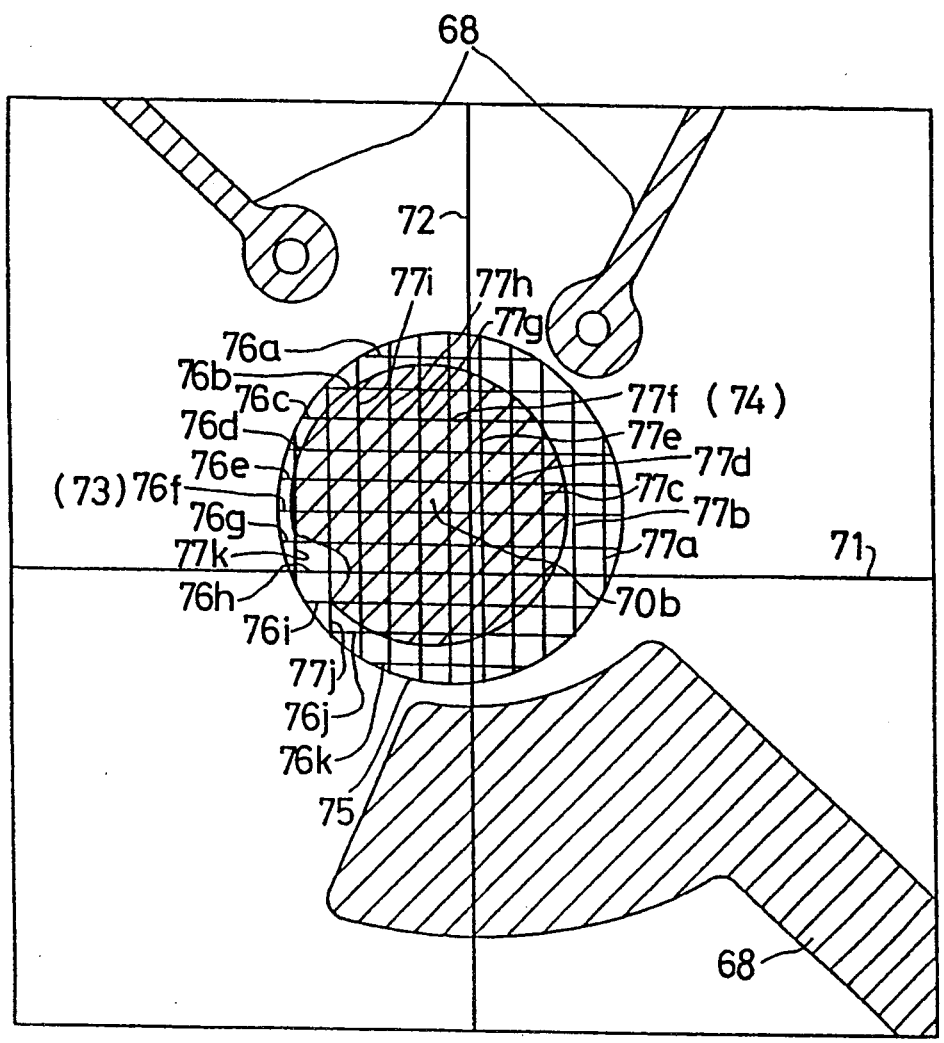
FIG. 8 is an explanatory diagram illustrating the detection of an area center in the mark position detecting process of the present invention.
Figure 9:
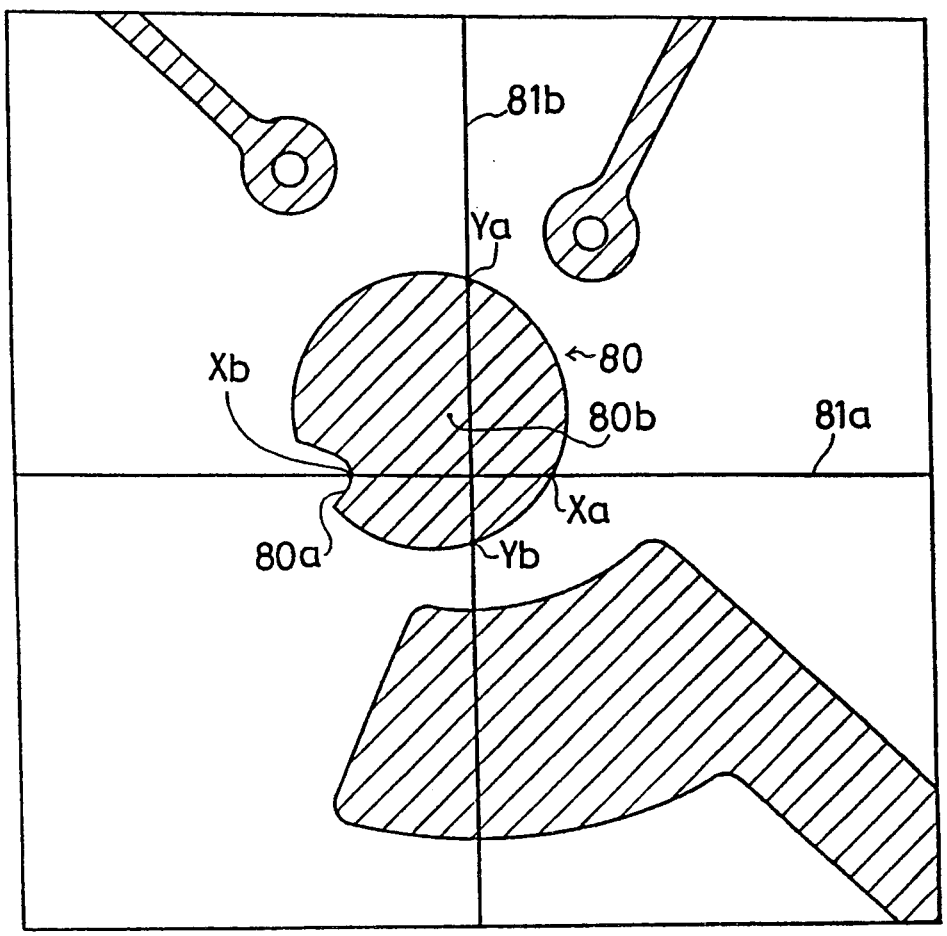
FIG. 9 is an explanatory diagram illustrating a first example of a mark position detecting process of the prior art.
Figure 10:
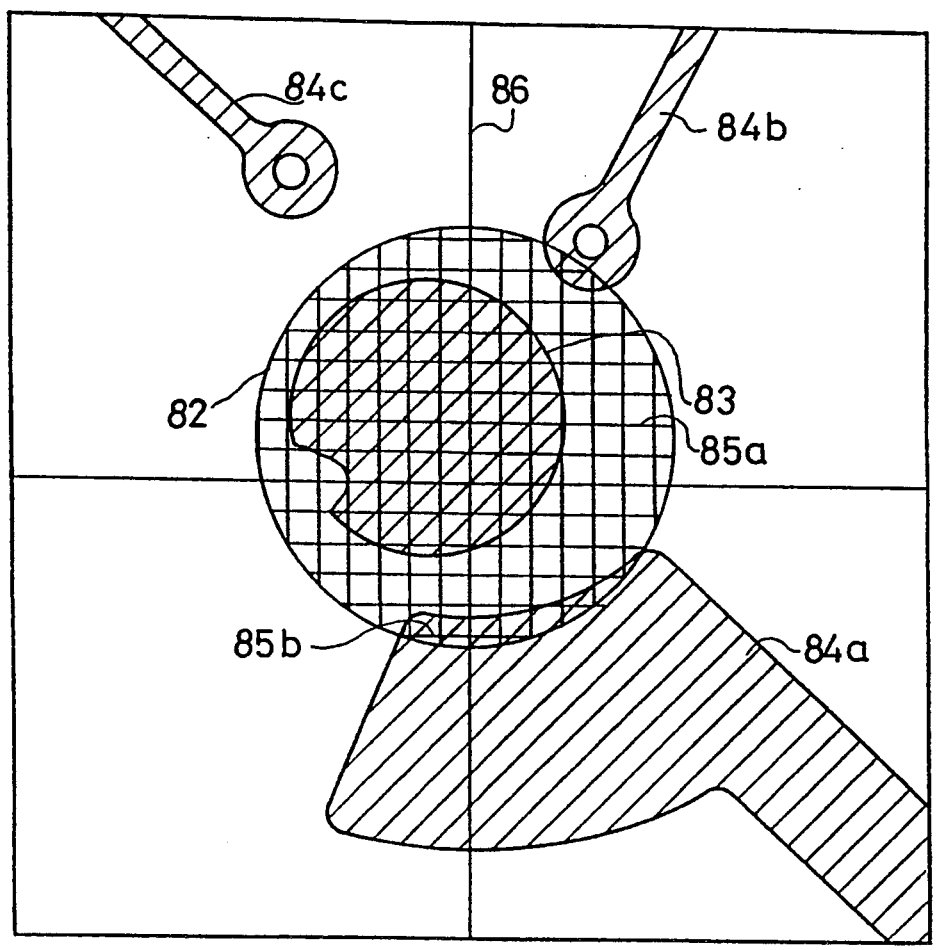
FIG. 10 is an explanatory diagram illustrating a second example of a mark position detecting process of the prior art.

In the standard circle 75, as shown in FIG. 8, there are set X-direction parting lines 76a and 76b to 76k arrayed at an equal pitch in parallel with the X axis 71, and Y-direction parting lines 77a and 77b to 77k arrayed at an equal pitch in parallel with the Y axis 72, and the standard circle 75 is separated into a plurality of sections (at Step f). The X-direction parting line 76f is aligned with the X-direction standard line 73 whereas the Y-direction parting line 77f is aligned with the Y-direction standard line 74.

The tones of the individual sections are determined (at Step g). Usually, the inside of the mark 70 is determined to be black, whereas the outside is determined to be white. In the section in which the outer circumference of the standard circle 75 is positioned, the black tone and the white tone are present in a mixed state. In this case, the section is deemed to belong to the tone if this tone occupies a larger ratio of the total area. In other words, the tone that occupies most of that particular section is selected, and the major tone is deemed to prevail in the section. If, however, the two tones occupy substantially equal areas of the section, this section is bisected to deem that the outer area belongs to the white tone whereas the inner area belongs to the black tone. In this way, the centers of the black tone are individually determined along the parting lines. Of the sections positioned above the X-direction parting line 76f, for example, what is decided to belong to the black tone is five sections at the lefthand side and four sections at the righthand side of the Y-direction standard line 74. Hence, the center is decided to be located at the center of the lefthand first section, i.e., at the position leftward by 0.5 sections. In this way, with respect to the X-direction parting lines 76a to 76n, the centers of the sections that are determined to belong to the black tone are individually determined, and their average is computed to determine the X-direction center position of the mark 70.

Of the sections located at the righthand side of the Y-direction parting line 77g, moreover, the upward fifth section and the downward fifth section from the X-direction standard line 73 have almost half of their areas occupied by the white tone and the black tone. Hence, the areas to be decided to belong to the black tone ranges from 4.5 sections upward to 4.5 sections downward from the X-direction standard line 73. Thus, the center is deemed to fall on the X-direction standard line 73. Thus, with reference to the Y-direction parting lines 77a to 77k, the centers of the sections to be decided to belong to the black tone are individually determined, and their averages are computed to determine the Y-direction center position of the mark 70. As described above, the center 70b of the mark 70 is detected by determining the X- and Y-direction center position of the mark 70 individually (at Step h).

When the center of the mark 70 is thus detected, the position of the printed circuit board W is adjusted by the X-Y table 101 and the holding means 102, and the base plate 52 is moved by the drive of the motor 49 (as shown in FIG. 3) to bring the drill 61c precisely to a position facing the center 70b of the drill 70 (at Step i). Then, the spindle motor 61a is driven to perforate the standard hole in the printed circuit board W by means of the drill 61c (at Step j).

When the perforations of the mark 70 are completed by the aforementioned Steps a to j, it is decided whether or not an unperforated reference mark remains on the printed circuit board W. If YES, the Steps a to j similar to the aforementioned ones are repeated to perform the perforations. If it is decided that there is no unperforated mark left, the printed circuit board W is removed (at Step l) because the perforations of all the marks of the printed circuit board W are completed.

Although not specifically described, the printed circuit board W is pressed on the basis of the standard holes perforated by the aforementioned steps, to provide individual parts (e.g., wiring boards).

According to the mark position detecting process A (including the Steps b to h) of the present invention, the interim center 70a is determined at first by the four-points searching method (at Step c), and the mark diameter D1 is computed (at Step d). After this, the standard circle 75 having a slightly larger diameter D2 than the mark diameter D1 is set, and the center of the area is detected by determining and averaging the centers of the identical tones on the basis of the standard circle 75 (at Steps f to h). As a result, the center 70b can be precisely detected. Moreover, the problems of setting the standard circle, that arise when determining the center of the area of the mark by the method of the prior art, can be eliminated, to set a proper standard circle automatically even if the user does not confirm and select them one by one. As a result, the process can be simplified to shorten the required time for determining the centers, improper standard circles will not be set, and inaccuracy in detecting the center position will be prevented. Moreover, the forming of the perforations can be automated.

As described above, the method according to the present invention uses image processing for detecting the center position of a reference mark so that it can detect a precise center position. In this process, moreover, a standard circle having a proper size corresponding to that of the mark is automatically set so that the forming of perforations can be simplified, shortened and automated.

Although the present invention has been fully described by way of example with reference to the accompanying drawings, it is to be understood that various changes and modifications will be apparent to those skilled in the art. Therefore, unless such changes or modifications depart from the scope of the invention, they should be construed as being included therein.

What we claim is:

1. A method of machining a printed circuit board, comprising the steps of:

detecting the position of a reference mark formed in advance on the printed circuit board, with imaging means and an image processing device, said step of detecting the position of the reference mark comprising the steps of:

image-recognizing said mark to detect a tone transition point on X and Y axes;

determining an interim center and diameter of said image-recognized mark on the basis of said tone transition point;

adding a predetermined minute value to said image-recognized mark diameter to compute a value of the diameter of a standard circle;

setting said standard circle to have the computed value as its diameter and said interim center as its center; and image-processing in said standard circle to determine the center of said mark; and machining said printed circuit board with machining means with reference to said detected mark position.

2. A method according to claim 1, wherein said step of image-processing in said standard circle to determine the center of said mark, includes the steps of:

separating said standard circle with equidistantly spaced lines extending parallel to said X and Y axes to form a plurality of separate areas, determining a tone of each of said areas as a function of the ratio of a first and a second tone therein, averaging the determined tones of said areas in directions parallel to said X and Y axes to determine a center position.

3. A method of processing a printed circuit board, wherein the board has a mark thereon with a first distinguishing tone and the board surrounding the mark has a second distinguishing tone, said method comprising the steps of:

producing an image of said mark with image processing means, detecting intersections first and second axes at a periphery of the image, averaging the distances between said intersections, on each of said first and second axes, to determine first and second diameters on said first and second axes and an interim center, averaging said first and second diameters to determine a mark diameter, adding a predetermined value to said mark diameter to determine a standard circle diameter, centering a standard circle of said standard circle diameter at said interim center, separating said standard circle with equidistantly spaced lines extending parallel to said first and second axes to form a plurality of separate areas, determining a tone of each of said areas as a function of the ratio of the first and second tones therein, averaging the determined tones of said areas in directions parallel to said first and second axes to determine a center position, and machining said printed circuit board using a position thereon corresponding to said center position as a reference.

4. A method according to claim 3, wherein said step of averaging includes the step of determining the number of said separate areas in directions parallel to said first and second axes comprising at least 50% of said first tone, and determining a mid-point of said determined separate areas as said center position.

5. A method according to claim 3, wherein said first and second axes are orthogonal axes.

6. A method according to claim 3, wherein said plurality of separate areas each have a square configuration.

7. An apparatus for processing a mark on a printed circuit board, wherein the board has a mark thereon with a first distinguishing tone and the board surrounding the mark has a second distinguishing tone, comprising:

means for producing an image of said mark, means for:

intersecting the image with first and second orthogonal axes, determining first and second coordinates on each of said first and second axes, respectively, corresponding to intersection points of said axes with a periphery of said image, determining an interim center from said first and second coordinates, averaging the distances between the intersection points on said first and second axes to determine a mark diameter, adding a predetermined value to said mark diameter to provide a standard diameter, centering a circle with said standard diameter at said interim center, separating said circle into a plurality of areas with equidistantly spaced lines extending parallel to said first and second axes, determining a tone for each of said areas as a function of the ratio of said first and second tones therein, determining the coordinates of a final center with respect to which an equal number of areas of said first tone occur in directions parallel to said first and second axes, and means for machining said board at a point corresponding to said final center of said image.

8. An apparatus according to claim 7, further including means for moving said board and said means for machining relative to each other so that said means for machining can machine said board at a point corresponding to said final center of said image.

9. An apparatus according to claim 7, wherein said means for machining includes means for boring a hole through said board.

10. An apparatus according to claim 7, wherein said means for intersecting, determining first and second coordinates, determining an interim center, averaging, adding, centering, separating, determining a tone, and determining the coordinates of a final center, includes a central processing unit.

* * * * *